(12) United States Patent
Taracila et al.

(10) Patent No.: US 8,674,799 B2
(45) Date of Patent: Mar. 18, 2014

(54) TRANSFORMER ASSEMBLY FOR A MAGNETIC RESONANCE IMAGING SYSTEM

(75) Inventors: Victor Taracila, Aurora, OH (US); Fraser Robb, Aurora, OH (US); Aleksey Zemskov, Aurora, OH (US); Vijayanand Alagappan, Aurora, OH (US); Miguel Navarro, Aurora, OH (US)

(73) Assignee: General Electric Company, Schenectady, NY (US)

( * ) Notice: Subject to any disclaimer, the term of this patent is extended or adjusted under 35 U.S.C. 154(b) by 665 days.

(21) Appl. No.: 12/797,810

(22) Filed: Jun. 10, 2010

(65) Prior Publication Data

US 2011/0304422 A1  Dec. 15, 2011

(51) Int. Cl.
*H01F 5/00* (2006.01)
*H01F 27/28* (2006.01)

(52) U.S. Cl.
USPC .......................................... 336/200; 336/232

(58) Field of Classification Search
USPC ................................. 336/200, 232
See application file for complete search history.

(56) References Cited

U.S. PATENT DOCUMENTS

| | | | |
|---|---|---|---|
| 6,396,362 B1 * | 5/2002 | Mourant et al. | 333/25 |
| 6,606,022 B1 * | 8/2003 | Taurand | 336/200 |
| 6,822,450 B2 | 11/2004 | Klinge et al. | |
| 6,838,970 B2 * | 1/2005 | Basteres et al. | 336/200 |
| 6,967,555 B2 * | 11/2005 | Yu et al. | 336/200 |
| 2005/0156699 A1 * | 7/2005 | Hui et al. | 336/200 |
| 2007/0120622 A1 * | 5/2007 | Ezzeddine | 333/131 |
| 2008/0297298 A1 * | 12/2008 | Wei et al. | 336/200 |

FOREIGN PATENT DOCUMENTS

WO  WO 2007117604 A2 * 10/2007

* cited by examiner

*Primary Examiner* — Tsz Chan
(74) *Attorney, Agent, or Firm* — The Small Patent Law Group; Dean D. Small

(57) ABSTRACT

A transformer assembly includes a substrate having a first surface and an opposing second surface, a first spiral wound inductive coil formed on the first surface, and a second spiral wound inductive coil formed on the first surface; the first and second spiral wound inductive coils forming a double spiral arrangement on the first surface such that the first coil is inductively coupled to the second coil. An RF coil including the transformer assembly and a method of fabricating the transformer assembly are also described.

19 Claims, 7 Drawing Sheets

TRANSFORMER ASSEMBLY FOR A MAGNETIC RESONANCE IMAGING SYSTEM

BACKGROUND OF THE INVENTION

The subject matter disclosed herein relates generally to radio frequency (RF) coils, and more particularly to a transformer assembly used in an RF coil.

Magnetic Resonance Imaging (MRI) systems use RF coils to acquire image information of a region of interest of a scanned object. The resultant image that is generated shows the structure and function of the region of interest. At least one conventional MRI imaging system includes a multiple-channel array coil having a plurality of coil elements. The signals detected by the multiple-channel array coil are processed by a computer to generate MR images of the object being imaged. During operation, the plurality of coil elements are inductively or capacitively decoupled from the other coil elements. In the majority of the cases the inductive decoupling through overlapping is preferred. When overlapping between elements is not possible, the remote overlapping is performed. Because the setup resembles the classical transformer, the technique of remote inductive decoupling is also called the transformer decoupling. Accordingly, the conventional coil elements are decoupled from one another along a first direction using a transformer decoupling technique. Moreover, the coil elements are decoupled from one another along a second direction using a preamplifier decoupling technique.

The transformer decoupling technique utilizes a conventional transformer that is disposed between each pair of coil elements. The conventional transformer includes a pair of inductor coils that are wound around a cylindrical dielectric. In operation, the mutual inductance of the transformer inductors may have both a positive and a negative effect on the coil elements based on the reciprocal current directions in the coil elements. For example, when the coil element fluxes add up, or have same direction, then the mutual inductance is positive. However, when the current directions are opposed to each other, then the mutual inductance is negative. A positive mutual inductance is typically desired for under-lapped coil elements and a negative inductance is typically desired for overlapped coil elements.

However, inserting the conventional transformer between a pair of coil elements results in an additional inductance being added to the inductance of the coil elements. The additional inductance requires the coil elements to be retuned. Additionally, coupling adjustment of the conventional transformer is difficult. More specifically, the transformer inductors are stretched or compressed to achieve the desired inductance. After the inductor has been formed into a final state, the inductor is coated with a substance to maintain the inductor in the final state. Thus, the conventional transformers are not easily modified to alter the decoupling inductance.

BRIEF DESCRIPTION OF THE INVENTION

In accordance with one embodiment, a transformer assembly is provided. The transformer assembly includes a substrate having a first surface and an opposing second surface, a first spiral wound inductive coil formed on the first surface, and a second spiral wound inductive coil formed on the first surface; the first and second spiral wound inductive coils forming a double spiral arrangement on the first surface such that the first coil is inductively coupled to the second coil.

In another embodiment, a multiple channel array coil for magnetic resonance imaging is provided. The array coil includes a first coil, a second coil, and a transformer coupled between the first and second coils. The transformer includes a substrate having a first surface and an opposing second surface, a first spiral wound inductive coil formed on the first surface, and a second spiral wound inductive coil formed on the first surface; the first and second spiral wound inductive coils forming a double spiral arrangement on the first surface such that the first coil is inductively coupled to the second coil.

In a further embodiment, a method of fabricating a transformer assembly is provided. The method includes forming a first spiral electrical inductor on a first surface of a dielectric substrate, and forming a second spiral electrical inductor on the first surface of the substrate such that the first spiral inductor is interleaved with the second spiral inductor.

DETAILED DESCRIPTION OF THE INVENTION

Figure 1:
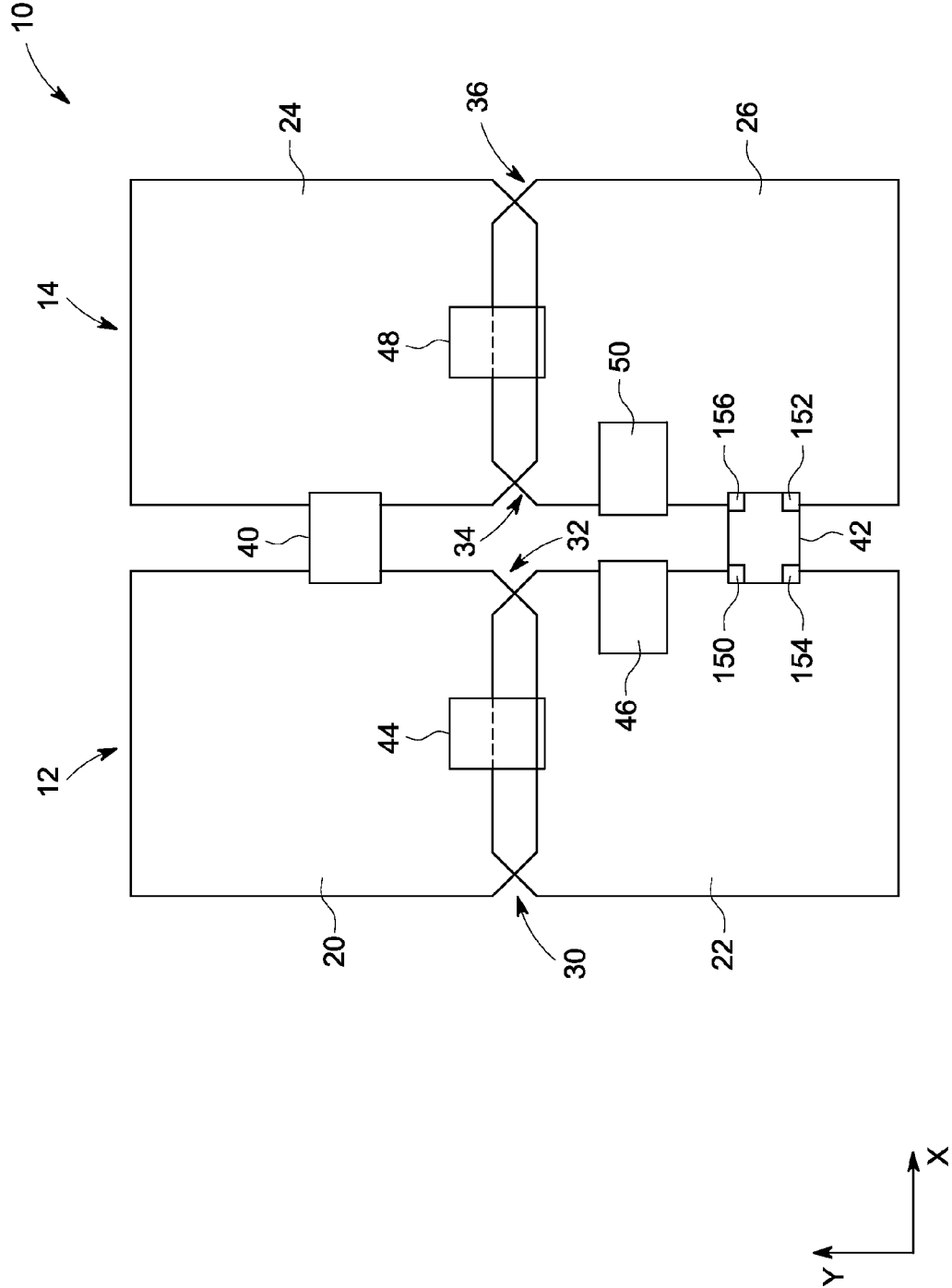
FIG. 1 is a schematic illustration of an exemplary multiple channel array coil formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide a transformer assembly that may be utilized with a multi-channel radio-frequency (RF) coil assembly. By practicing at least one embodiment, the transformer assembly described herein may be tuned prior to being installed in the MRI system, thus reducing labor costs associated with installation and tuning. The transformer assembly may be implemented in connection with different types of magnetic resonance coils, for example surface coils, operating at different frequencies, thus having different wavelengths.

FIG. 1 is a schematic illustration of an exemplary multiple channel array coil assembly 10 formed in accordance various embodiments. The array coil assembly 10 includes a left portion 12 and a right portion 14 as illustrated in FIG. 1. The left and right portions 12 and 14 are symmetrically arranged with one another and displaced from one another with respect to an x-axis. Each of the left and right portions 12 and 14 include a pair of individual, overlapping surface coil elements that are arranged along a y-axis. For example, the left portion 12 includes two generally rectangular, coil elements 20 and 22. Moreover, the right portion 14 includes two, generally rectangular, coil elements 24 and 26. In the exemplary embodiment, the coil elements 20, 22, 24 and 26 are generally rectangular in shape, and are formed from a generally flat, conductive material, for example, tin-plated copper. It should be realized that the multiple channel array coil assembly 10 may be used with other multiple channel array coils (not shown). For example, the array coil assembly 10 may be used to image a posterior section of a patient, whereas another array coil (not shown) may be disposed over or under the array coil assembly 10 to image an anterior portion of the patient.

In operation, the coil elements 20, 22, 24 and 26 are preferably physically separated from each other by, in some embodiments, overlapping the coil elements such that the coils 20, 22, 24 and 26 each generate a distinct sensitivity profile. For example, in this embodiment, the coil elements 20 and 24 are overlapped with the coil elements 22 and 26, respectively. As shown in FIG. 1, a portion of the coil elements 20 and 22 are inwardly bent at an angle of approximately 45 degrees from both sides, thereby resulting in two intersection points 30 and 32 such that the coil elements 20 and 22 overlap and intersect at a generally perpendicular angle with respect to one another. Moreover, a portion of the coil elements 24 and 26 are inwardly bent at an angle of approximately 45 degrees from both sides, thereby resulting in two intersection points 34 and 36 such that the coil elements 24 and 26 overlap and intersect at a generally perpendicular angle with respect to one another.

In the exemplary embodiment, the individual coil elements 20, 22, 24 and 26 are decoupled from one another along the x-direction using a transformer decoupling method. Accordingly, the array coil assembly 10 also includes a first transformer 40 that is coupled between the coil elements 20 and 24 and a second transformer 42 that is coupled between the coil elements 22 and 26. Moreover, the elements 20, 22, 24 and 26 are decoupled from one another along the y-direction using preamplifier decoupling. Accordingly, the array coil assembly 10 also includes a preamplifier 44 that is coupled to the coil element 20, a preamplifier 46 that is coupled to the coil element 22, a preamplifier 48 that is coupled to the coil element 24, and a preamplifier 50 that is coupled to the coil element 26. In the exemplary embodiment, the array coil assembly 10 also includes a plurality of capacitors (shown in FIG. 2). The operation and location of the capacitors is discussed in more detail below. However, it should be noted that other suitable overlapping and non-overlapping arrangements may be used.

Figure 2:
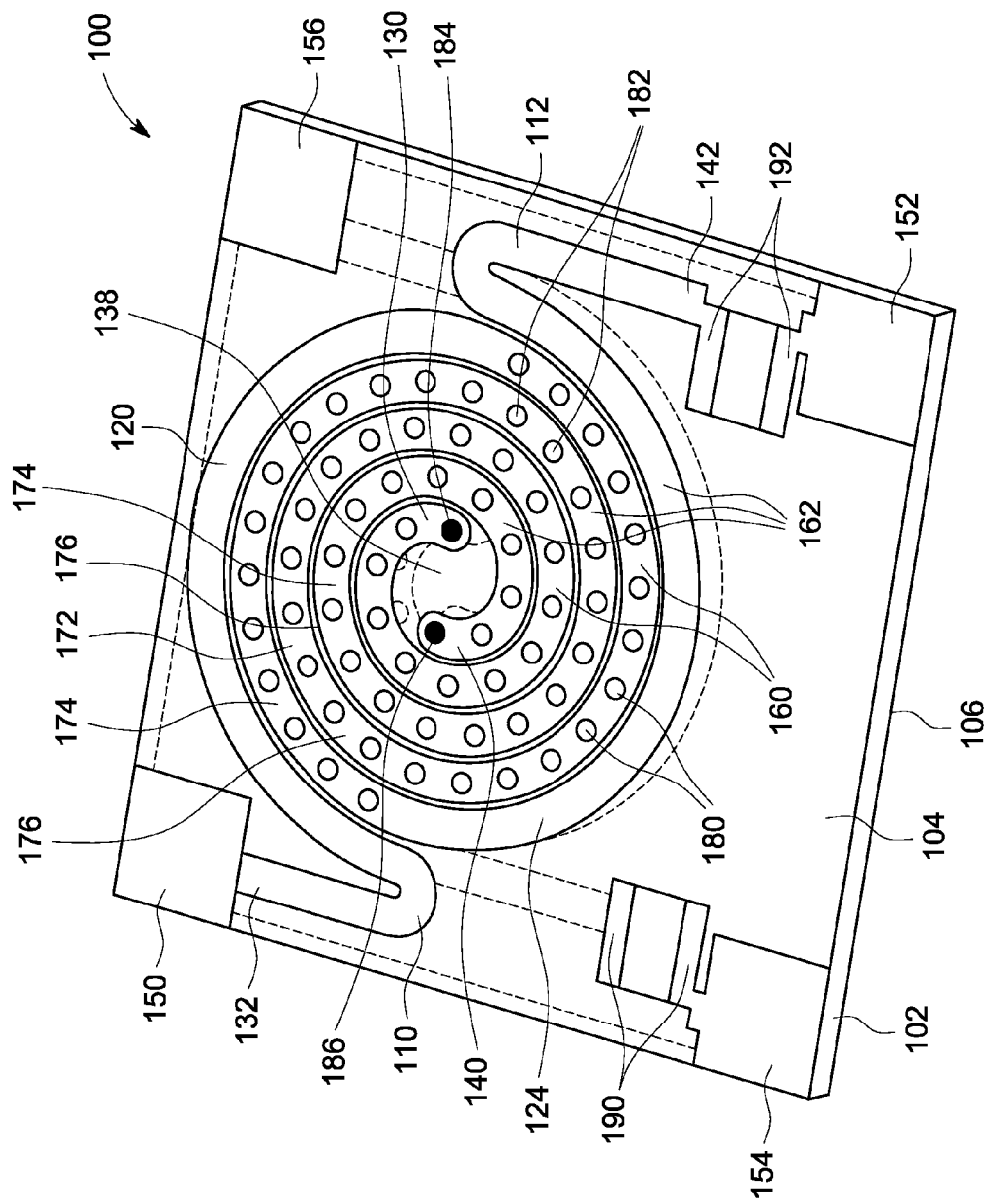
FIG. 2 is a top view of an exemplary transformer assembly formed in accordance with various embodiments.
Figure 3:
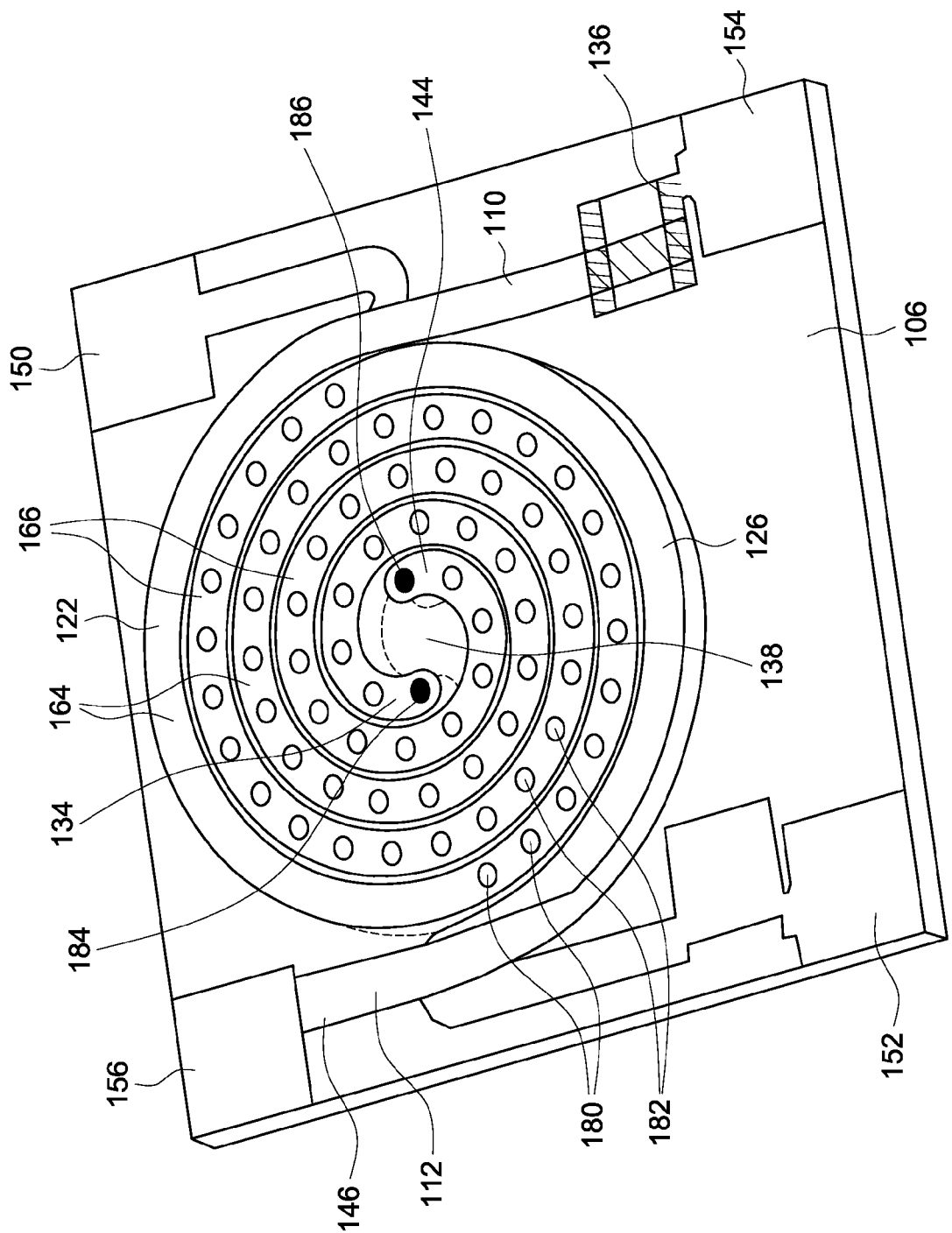
FIG. 3 is a bottom view of the exemplary transformer assembly shown in FIG. 2.

FIG. 2 is a top view of an exemplary tunable adjustable transformer assembly 100 that may be used with the array coil assembly 10 shown in FIG. 1 in accordance with various embodiments. FIG. 3 is a bottom view of the exemplary transformer assembly 100 shown in FIG. 2. It should be noted, that in the exemplary embodiment, the transformer assembly 100 may be installed in the multiple channel array coil assembly 10 shown in FIG. 1 in lieu of the transformer 40.

In the exemplary embodiment, the transformer assembly 100 includes a substrate 102 having a first surface 104 and an opposing second surface 106. The substrate 102 is fabricated using a dielectric material such as, for example FR4. FR4 is dielectric material that may be, for example, a fiberglass reinforced epoxy laminate that is flame retardant (FR) and self-extinguishing. In the exemplary embodiment, the first surface 104 is substantially planar or flat and the second opposing surface is also substantially planar or flat. Moreover, the first surface 104 is substantially parallel with the second surface 106.

The transformer assembly 100 also includes a first spiral inductor 110 and a second spiral inductor 112. As shown in FIG. 2, the first spiral inductor 110 includes a first inductor portion 120 that is formed on the first surface 104 of the substrate 102 and a second inductor portion 122 (shown in FIG. 3) that is formed on the second surface 106 of the substrate 102. The second spiral inductor 112 includes a first inductor portion 124 (shown in FIG. 2) that is formed on the first surface 104 of the substrate 102 and a second inductor portion 126 (shown in FIG. 3) that is formed on the second surface 106 of the substrate 102. In the exemplary embodiment, the first and second portions 120 and 124 and 122 and 126 are rigidly formed on the substrate 102 using, for example, a vapor chemical deposition procedure.

In the exemplary embodiment, the first inductor portion 120 is substantially symmetrical with the second inductor portion 122. More specifically, the spiral portion of the first inductor portion 120 has substantially the same size, shape, and relative orientation as the spiral portion of the second inductor portion 122, but is disposed on an opposite side of the substrate 102. It should be realized that although the spiral portions of the first and second inductor portions 120 and 122 are substantially similar, the electrical leads coupling the inductor portions 120 and 122 to external connections are different to enable all the external connections to be made to the same side of the transformer assembly 100.

Additionally, the first inductor portion 124 is substantially symmetrical with the second inductor portion 126. More specifically, the spiral portion of the first inductor portion 124 has substantially the same size, shape, and relative orientation as the spiral portion of the second inductor portion 126, but is disposed on an opposite side of the substrate 102. It should be realized that although the spiral portions of the first and second inductor portions 124 and 126 are substantially similar, the electrical leads coupling the first and second inductor portions 124 and 126 to external connections are different to enable all the external connections to be made to the same side of the transformer assembly 100. Therefore, although the first inductor portions 120 and 124 are described in detail below, it should be realized that the second inductor portions 122 and 126 are formed and have substantially the same dimensions and operational characteristics as the first inductor portions 120 and 124.

As shown in FIG. 2, the first inductor portion 120 includes a first end 130 and an opposite second end 132. The first end 130 is disposed proximate to a center point 138. The second end 132 is disposed radially outward from the center point 138 proximate to an edge of the substrate 102. As shown in FIG. 3, the second inductor portion 122 includes a first end 134 and an opposite second end 136. The first end 134 is disposed proximate to the center point 138. The second end 136 is disposed radially outward from the center point 138 proximate to the edge of the substrate 102.

As shown in FIG. 2, the second inductor portion 124 includes a first end 140 and an opposite second end 142. The first end 140 is disposed proximate to the center point 138. The second end 142 is disposed radially outward from the center point 138 proximate to the edge of the substrate 102. As shown in FIG. 3, the second inductor portion 126 includes a first end 144 and an opposite second end 146. The first end 144 is disposed proximate to the center point 138. The second end 146 is disposed radially outward from the center point 138 proximate to the edge of the substrate 102. In the exemplary embodiment, the first ends 130, 134, 140 and 144 are each disposed at an angle with respect to the center point 138. More specifically, the first ends 130 and 134 of the first spiral inductor 110 are disposed approximately 180 degrees from the first ends 140 and 144 of the second spiral inductor 112.

The transformer assembly 100 also includes four mounting pads 150, 152, 154 and 156. As shown in FIG. 2, the second end 132 of the first inductor portion 120 is electrically coupled to the mounting pad 150. Additionally, the second end 142 of the second inductor portion 124 is electrically coupled to the mounting pad 152 via a pair of capacitors that are discussed in more detail below. Referring to FIG. 3, the second end 136 of the second inductor portion 122 is electrically coupled to the mounting pad 154 via a pair of capacitors that are discussed in more detail below. Additionally, the second end 146 of the second inductor portion 126 is electrically coupled to the mounting pad 156.

During assembly, the mounting pads 150, 152, 154 and 156 are utilized to couple the transformer assembly 100. For example, referring again to FIG. 1, in the exemplary embodiment, the transformer assembly 100 is coupled between the coil elements 22 and 26. Therefore, each end of the coil element 22 is coupled to a respective mounting pad 150 and 154. Moreover, each end of the coil element 26 is coupled to a respective mounting pad 152 and 156 to enable the transformer assembly to be coupled between the coil element 22 and the coil element 26.

Referring again to FIGS. 2 and 3, in the exemplary embodiment, the spiral inductors 110 and 112 each form a planar curve traced by a point circling about the center point 138 at an increasing distances from the center point 138. Therefore, the spiral inductors 110 and 112 each includes a plurality of turns 160 and 162, respectively, that are coplanar with respect to each other. In the exemplary embodiment, the spiral inductors 110 and 112 have two and a half turns 160 and 162, respectively, wherein each turn spans approximately 360 degrees such that an overall length of each of the inductors 110 and 112 is approximately 900 degrees.

Additionally, the first and second spiral wound inductors 110 and 112 form a double spiral arrangement. For example, as shown in FIG. 2, the turns 160 of the first inductor portion 120 are interspersed or interleaved between the turns 162 of the second inductor portion 124 on the first surface 104 of the substrate 102. Moreover, as shown in FIG. 3, the turns 164 of the first inductor portion 122 are interspersed or interleaved between the turns 166 of the second inductor portion 126 on the second surface 106 of the substrate 102. In the exemplary embodiment, the inductors 110 and 112 each have a substantially rectangular cross-sectional profile. Additionally, each of the turns 160, 162, 164 and 166 are separated from the other adjacent turns by a predetermined distance. For example, a turn 170 in the first spiral inductor 110 is separated from a turn 172 and a turn 174 in the second spiral inductor 112 by a gap 176. The size of the gap 176, which may be predetermined, facilitates electrically isolating the turns from each other. Moreover, the locations of the two double interleaved spiral inductors 110 and 112, with respect to each other, facilitates generating a relatively strong inductive coupling between the two spiral inductors 110 and 112.

As discussed above, the first and second spiral inductors 110 and 112 each have a substantially rectangular shape that represents an Archimedes spiral that may defined as:

$$R_{central}(\phi)=R_0+s(\phi-\phi_0) \quad \text{Equation 1}$$

where:
w is the width of the spiral conductor;
$w_{gap}$ is the width of the gap between the turns;
$R_0$ is the starting radius of the turns; and
$\phi_0=\pi$–the starting angle having a slope $$s = \frac{w + w_{gap}}{2\pi}.$$

The Cartesian coordinates for the spiral inductors 110 and 112 may be defined as:

$$x_{central}(\phi)=R_{central}(\phi)\cos(\phi),$$

$$y_{central}(\phi)=R_{central}(\phi)\sin(\phi).$$

Referring again to FIGS. 2 and 3, the transformer assembly 100 also includes a plurality of openings 180 that extend through the first inductor portion 120, the substrate 102, and the second inductor portion 122. The transformer assembly 100 also includes a plurality of openings 182 that extend through the first inductor portion 124, the substrate 102, and the second inductor portion 126. The transformer assembly 100 further includes a first pin 184 that is configured to be inserted into at least one of the openings 180. The transformer assembly 100 also includes a second pin 186 that is configured to be inserted into at least one of the openings 182. In the exemplary embodiment, the pins 184 and 186 are inserted into only one of the openings 180 and 182, respectively, to form a pair of operational inductors 110 and 112 respectively, as is discussed in more detail below. The pins 184 and 186 are fabricated from a conductive material, such as copper.

The location of the openings 180 and 182 enables the reactance of the transformer assembly 100 to be adjustable. For example, initially the pin 184 is inserted into an opening 180. Moreover, the pin 186 is inserted into an opening 182. The mutual inductance of the transformer assembly 100 is then measured. To change the mutual inductance of the transformer assembly 100, the pins 184 and/or 186 may be repositioned to a second different opening until the desired mutual inductance is achieved. In the exemplary embodiment, the pins 184 and 186 are positioned into a specific opening that creates a mutual inductance that is substantially equal to a pair of capacitors 190 and 192 that are coupled to the respective inductor 110 and 112. In the exemplary embodiment, the capacitors forming the pair of capacitors 190 are coupled in series. Moreover, the capacitors forming the pair of capacitors 192 are coupled in series. Accordingly, the location of the pins 184 and 186 are adjustable such that the inductances of the first and second inductors 110 and 112 can be chosen within certain limits when trying to resonate the transformer assembly 100 with a given capacitor, such as the pair of capacitors 190 and 192. After, the pins 184 and 186 have been positioned in an opening 180 and 182, respectively, the pins 184 and 186 are permanently affixed within the opening. For example, the opposite ends of the pins 184 and 186 are soldered or brazed to the first and second inductors 110 and 112, respectively.

Figure 4:
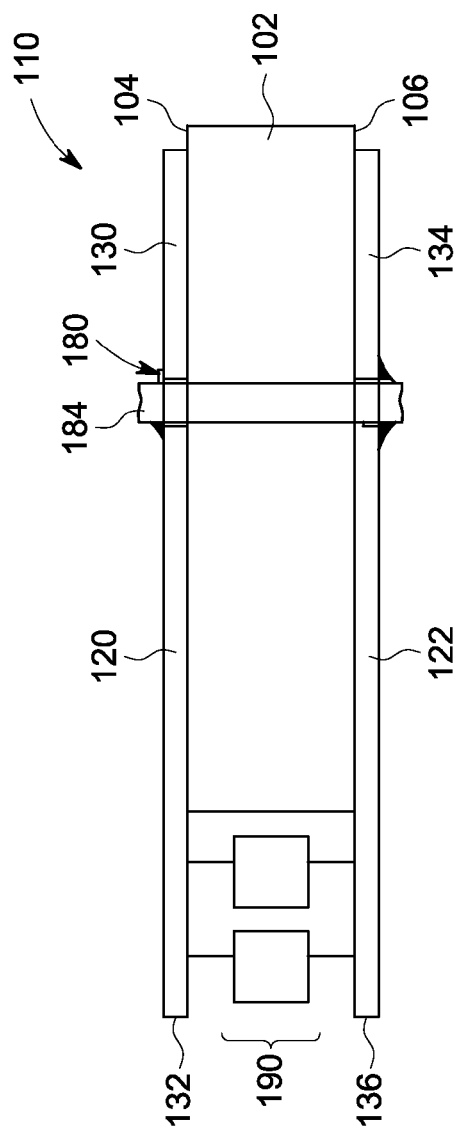
FIG. 4 is a side view of a portion of the transformer assembly shown in FIGS. 2 and 3.

FIG. 4 is a side view of the inductor 110. It should be realized that to simplify the explanation of the inductor 110, the inductor 110 is shown as being unfolded, whereas in the exemplary embodiment, the inductor 110 is arranged as a spiral as discussed above. As shown in FIG. 4, the inductor 110 includes the first inductor portion 120 mounted on the first side 104 of the substrate 102 and the second inductor portion 122 mounted on the second side 106 of the substrate 102. The pin 184 is inserted into the opening 180 to couple the first end 130 of the first inductor portion 120 to the first end 134 of the second inductor portion 122 to form an inductor. During operation, current is transmitted through the second end 132 of the first inductor portion 120, through the first inductor portion 120, through the pin 184, through the second inductor portion 124, and through the second end 136 of the second inductor portion 122.

Figure 5:
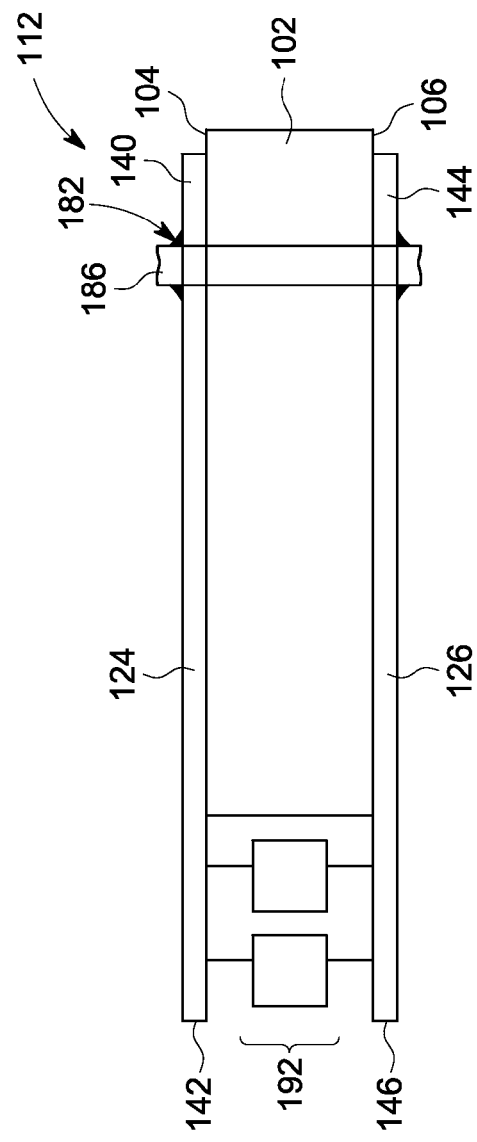
FIG. 5 is another side view of a portion of the transformer assembly shown in FIGS. 2 and 3.

FIG. 5 is a side view of the inductor 112. It should be realized that to simplify the explanation of the inductor 112, the inductor 112 is shown as being unfolded, whereas in the exemplary embodiment, the inductor 112 is arranged as a spiral as discussed above. As shown in FIG. 5, the inductor 112 includes the first inductor portion 124 mounted on the first side 104 of the substrate 102 and the second inductor portion 126 that is mounted on the second side 106 of the substrate 102. The pin 186 is inserted into the opening 182 to couple the first end 140 of the first inductor portion 124 to the first end 144 of the second inductor portion 126 to form an inductor. During operation, current is transmitted through the second 142 of the first inductor portion 124, through the first inductor portion 124, through the pin 186, through the second inductor portion 126, and exits through the second end 146 of the second inductor portion 122.

Figure 6:
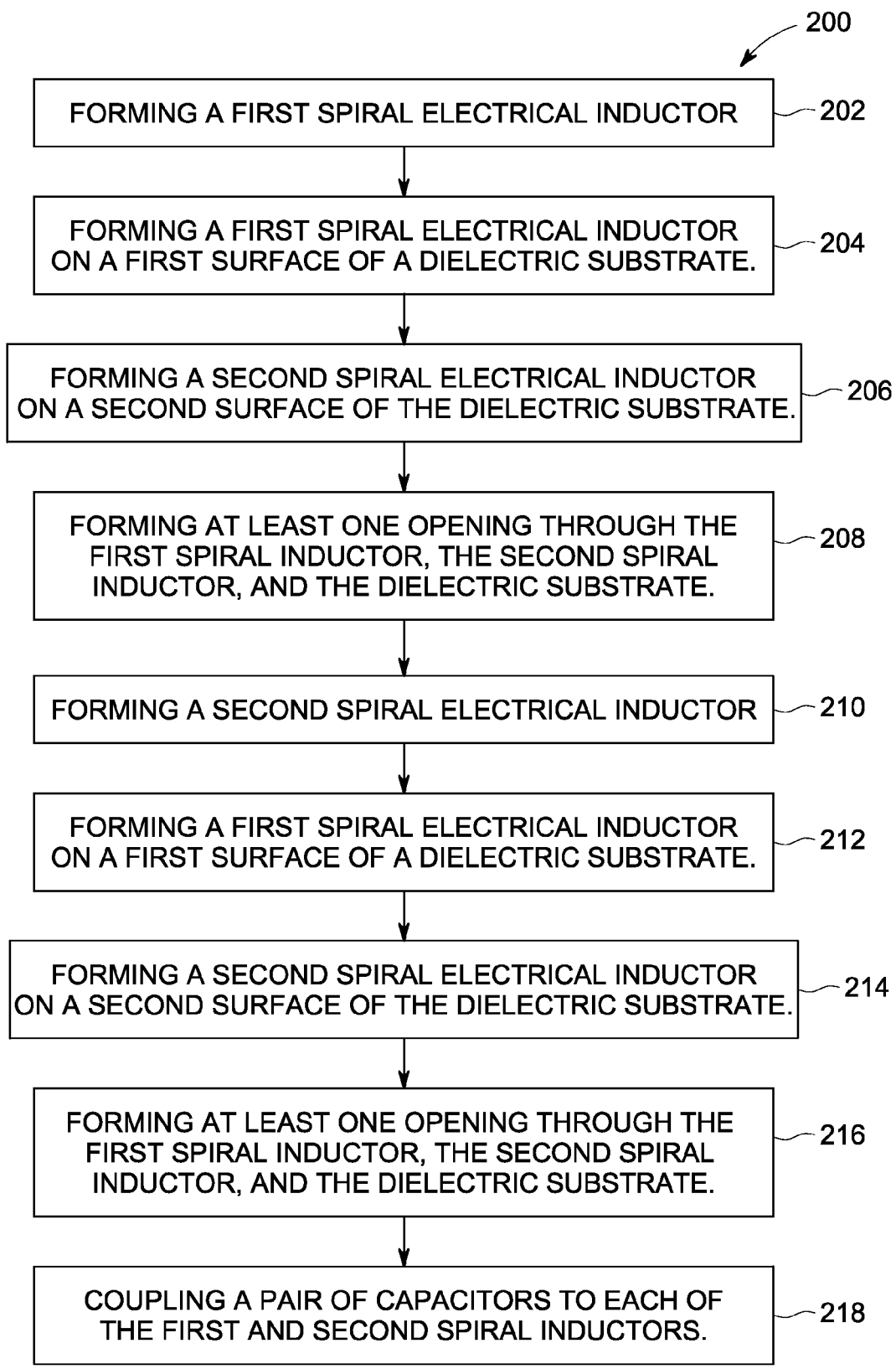
FIG. 6 is a flowchart of an exemplary method of fabricating an inductor assembly in accordance with various embodiments.

FIG. 6 is a flowchart of an exemplary method 200 of fabricating a transformer assembly such as the transformer assembly shown in FIGS. 1-4. At 202 a first spiral electrical inductor is formed. More specifically, at 204 a first inductor portion is formed on a first surface of a dielectric substrate. In one embodiment, the first spiral inductor portion may be formed as a separate unit that is affixed to a dielectric substrate using, for example, an epoxy. In other embodiments, the first spiral inductor portion is formed on the dielectric substrate using a chemical vapor deposition procedure. More specifically, the first spiral inductor portion is produced by depositing a thin film of copper material on the dielectric substrate.

At 206, a second spiral inductor portion is formed on an opposite side of the dielectric substrate that includes the first spiral inductor. Similar to the first spiral inductor, the second spiral inductor may be formed as a separate unit that is affixed to the dielectric substrate or formed on the dielectric substrate using a chemical vapor deposition procedure. In the exemplary embodiment, the second spiral inductor is formed to be symmetrical to the first spiral inductor. More specifically, the first spiral inductor is substantially the same size and has substantially the same shape and relative orientation of corresponding turns as the second spiral inductor.

At 208, at least one opening is formed through the first spiral inductor, the second spiral inductor, and the dielectric substrate. In the exemplary embodiment, a plurality of openings are formed through the first spiral inductor, the second spiral inductor, and the dielectric substrate. In the exemplary embodiment, the locations of the openings are calculated for specified pin positions in radians and inductance values. For example, the openings may be located such that each opening produces a change in inductance of 1 picoFarad (pF). Thus, positioning the pin in a first opening generates an initial inductance value. Whereas, positioning the pin in a second different opening generates an inductance value that is 1 pF less than the initial inductance value, etc. In this manner, the openings provide incremental adjustments, e.g. 1 pF for example, in inductance.

At 210 a second spiral electrical inductor is formed. More specifically, at 212, a first inductor portion is formed on a first surface of a dielectric substrate such that the first spiral inductor portion forming a portion of the first spiral inductor is interleaved with the first spiral inductor portion forming a part of the second spiral inductor.

At 214, a second spiral inductor portion is formed on an opposite side of the dielectric substrate that includes the first spiral inductor. Similar to the first spiral inductor, the second spiral inductor may be formed as a separate unit that is affixed to the dielectric substrate or formed on the dielectric substrate using a chemical vapor deposition procedure. In the exemplary embodiment, the second spiral inductor is formed to be symmetrical to the first spiral inductor. More specifically, the first spiral inductor is the substantially the same size and has substantially the same shape and relative orientation of corresponding turns as the second spiral inductor.

At 216, at least one opening is formed through the first spiral inductor and a second different pin is inserted into the opening in the second spiral inductor. As discussed above, a metallic pin is installed in each of the first and second inductors using, for example, a brazing or soldering procedure. Optionally, the metallic pins may be secured to both the first and second inductors using, for example, an epoxy material At 218, a pair of capacitors are coupled to each of the first and second spiral inductors. During operation, the inductor assemblies described herein are adjustable to enable the inductor assemblies to be utilized with various capacitors. Accordingly, a capacitance value of the pairs of capacitors to be coupled to the inductor assembly to form the resonant circuit may be identified.

Figure 7:
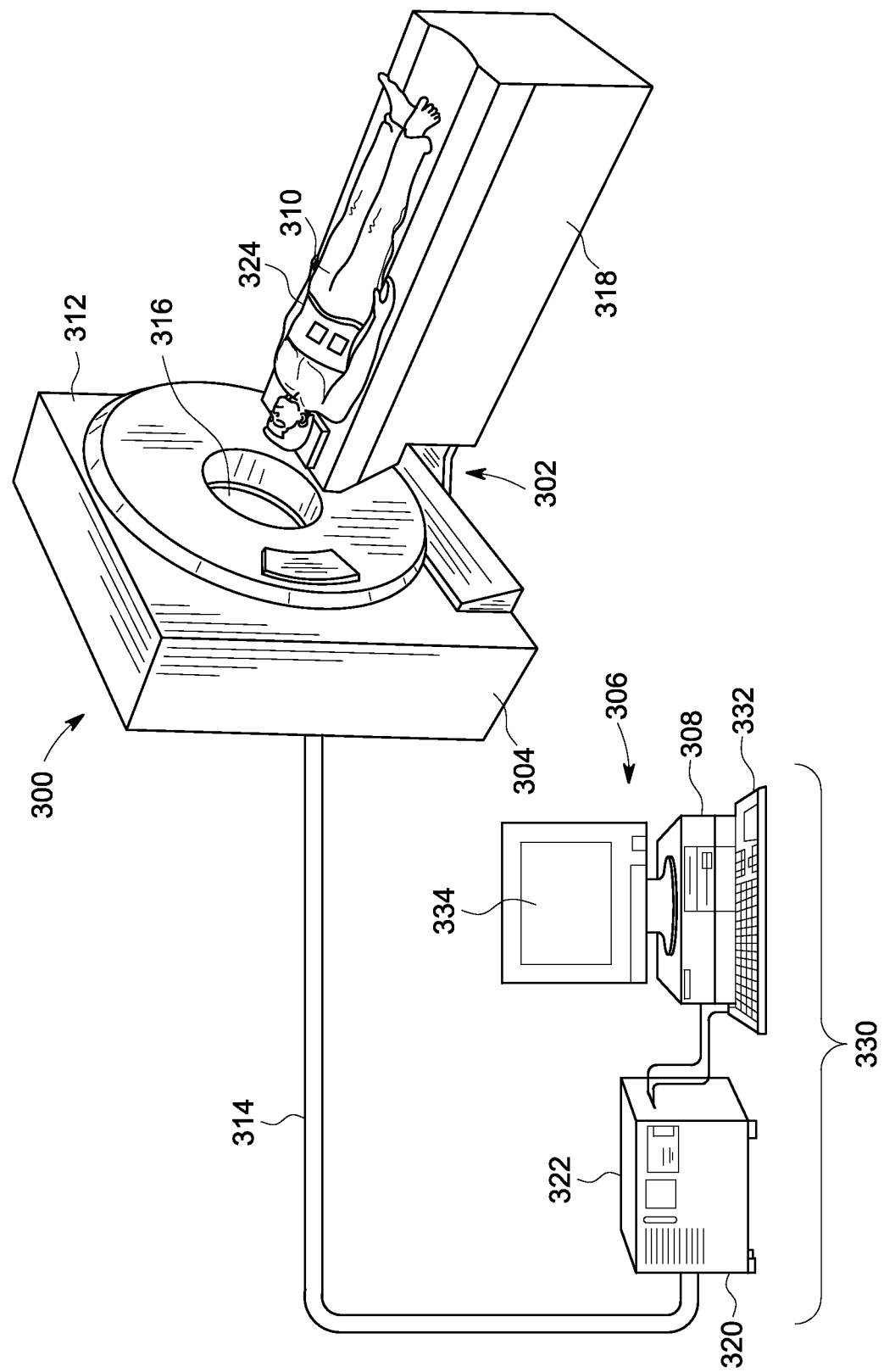
FIG. 7 is a pictorial view of an exemplary medical imaging system that may be utilized with an exemplary inductor assembly formed in accordance with various embodiments.

Various embodiments of the transformer assembly described herein may be provided as part of, or used with, a medical imaging system, such as imaging system 300 shown in FIG. 7. It should be appreciated that although the imaging system 300 is illustrated as a single modality imaging system, the various embodiments may be implemented in or with multi-modality imaging systems. The imaging system 300 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 7, the imaging system 300 includes an imaging portion 302 having an imaging unit 304 (e.g., imaging scanner) and a processing portion 306 that may include a processor 308 or other computing or controller device. In particular, the imaging unit 304 enables the imaging system 300 to scan an object or patient 310 to acquire image data, which may be image data of all or a portion of the object or patient 310. The imaging unit 304 includes a gantry 312 having one or more imaging components (e.g., magnets or magnet windings within the gantry 312) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 306 via a communication link 314 that may be wired or wireless. During an imaging scan by the imaging unit 304, the gantry 312 and the imaging components mounted thereon or therein may remain stationary or rotate about or along a center of rotation defining an examination axis through a bore 316. The patient 310 may be positioned within the gantry 312 using, for example, a motorized table 318.

In operation, an output of one or more of the imaging components is transmitted to the processing portion 306, and vice versa, which may include transmitting signals to or from the processor 308 through a control interface 320. The processor 308 also may generate control signals for controlling the position of the motorized table 318 or imaging components based on user inputs or a predetermined scan. During a scan, image data, such as magnetic resonance image data from the imaging components may be communicated to the processor 308 through a data interface 322 via the control interface 320, for example, as acquired by the surface coil 324, illustrated as a torso surface coil array in FIG. 7.

The processor 308 and associated hardware and software used to acquire and process data may be collectively referred to as a workstation 330. The workstation 330 includes a keyboard 332 and/or other input devices such as a mouse, a pointer, and the like, and a monitor 334. The monitor 334 displays image data and may accept input from a user if a touchscreen is available.

Figure 8:
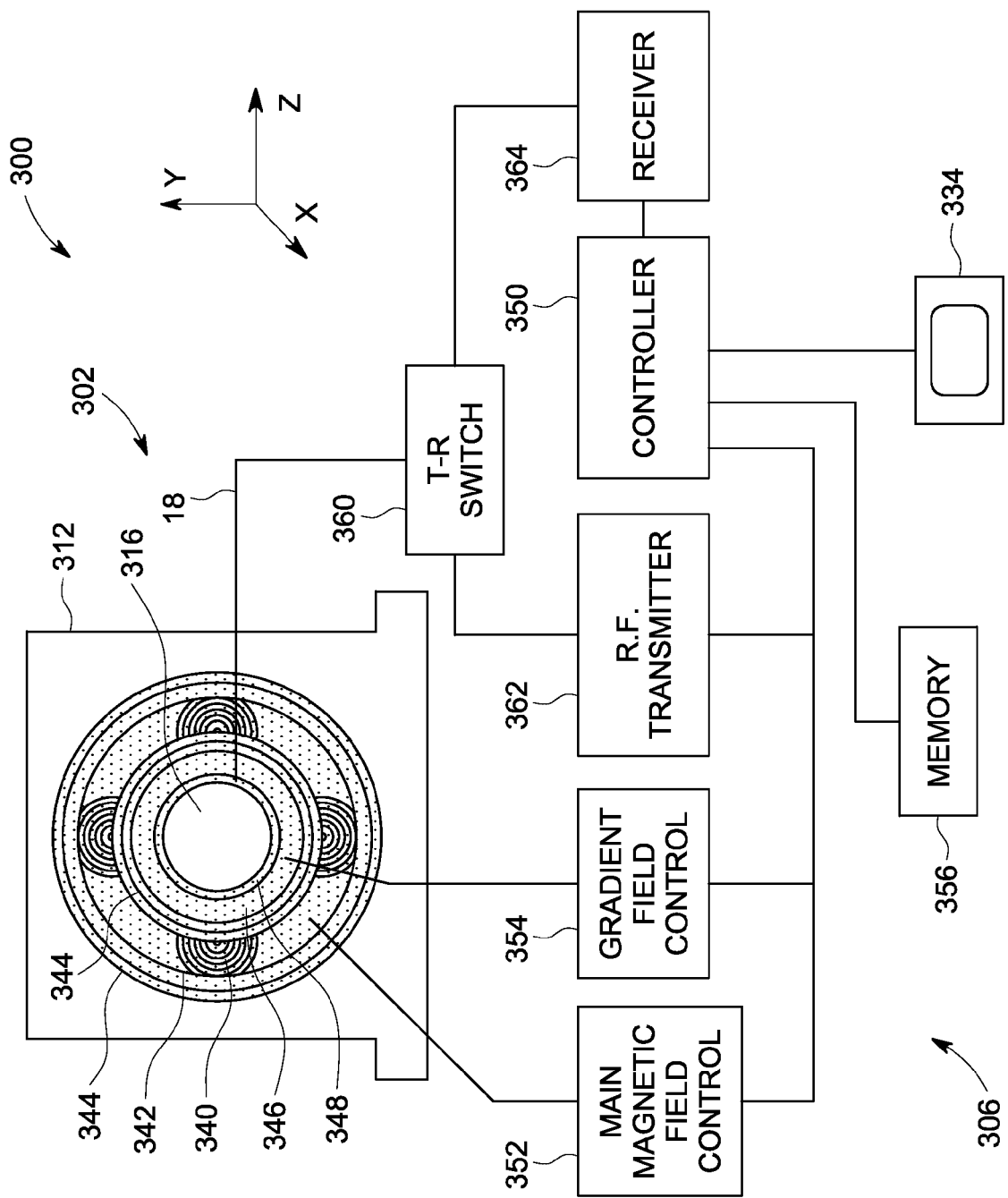
FIG. 8 is a simplified schematic illustration of the medical imaging system shown in FIG. 7.

FIG. 8 is a schematic illustration of the imaging system 300 shown in FIG. 7. In the exemplary embodiment, the imaging system 300 also includes a superconducting magnet 340 formed from magnetic coils supported on a magnet coil support structure. However, in other embodiments, different types of magnets may be used, such as permanent magnets or electromagnets. A vessel 342 (also referred to as a cryostat) surrounds the superconducting magnet 340 and is filled with liquid helium to cool the coils of the superconducting magnet 340. A thermal insulation 344 is provided surrounding the outer surface of the vessel 342 and the inner surface of the superconducting magnet 340. A plurality of magnetic gradient coils 346 are provided within the superconducting magnet 340 and an RF transmit coil 348 is provided within the plurality of magnetic gradient coils 346. In some embodiments the RF transmit coil 348 may be replaced with a transmit and receive coil as described in more detail herein. The components within the gantry 312 generally form the imaging portion 302. It should be noted that although the superconducting magnet 340 is a cylindrical shaped, other shapes of magnets can be used.

The processing portion 306 also generally includes a controller 350, a main magnetic field control 352, a gradient field control 354, a memory 356, the display device 334, a transmit-receive (T-R) switch 360, an RF transmitter 362 and a receiver 364.

In operation, a body of an object, such as the patient 310 (shown in FIG. 14) or a phantom to be imaged, is placed in the bore 316 on a suitable support, for example, the motorized table 318 (shown in FIG. 14) or other patient table. The superconducting magnet 340 produces a uniform and static main magnetic field $B_o$ across the bore 316. The strength of the electromagnetic field in the bore 316 and correspondingly in the patient 310, is controlled by the controller 350 via the main magnetic field control 352, which also controls a supply of energizing current to the superconducting magnet 340.

The magnetic gradient coils 346, which include one or more gradient coil elements, are provided so that a magnetic gradient can be imposed on the magnetic field $B_o$ in the bore 316 within the superconducting magnet 340 in any one or more of three orthogonal directions x, y, and z. The magnetic gradient coils 346 are energized by the gradient field control 354 and are also controlled by the controller 350.

The RF transmit coil 348, which may include a plurality of coils (e.g., resonant surface coils), is arranged to transmit magnetic pulses and/or optionally simultaneously detect MR signals from the patient 310 if receive coil elements are also provided, such as the surface coil 324 (shown in FIG. 14) configured as an RF receive coil. Moreover, the transformer assembly described herein may be coupled between pairs of transmit or receive coils as described in FIG. 1. The RF transmit coil 348 and the receive surface coil 324 are selectably interconnected to one of the RF transmitter 362 or receiver 364, respectively, by the T-R switch 360. The RF transmitter 362 and T-R switch 360 are controlled by the controller 350 such that RF field pulses or signals are generated by the RF transmitter 362 and selectively applied to the patient 310 for excitation of magnetic resonance in the patient 310. In the exemplary embodiment, any of the inductor assemblies described herein, may be utilized with the RF coils shown in FIG. 8.

Following application of the RF pulses, the T-R switch 360 is again actuated to decouple the RF transmit coil 348 from the RF transmitter 362. The detected MR signals are in turn communicated to the controller 350. The controller 350 includes a processor (e.g., image reconstruction processor), for example, the processor 308 (shown in FIG. 14), that controls the processing of the MR signals to produce signals representative of an image of the patient 310.

The processed signals representative of the image are also transmitted to the display device 334 to provide a visual display of the image. Specifically, the MR signals fill or form a k-space that is Fourier transformed to obtain a viewable image. The processed signals representative of the image are then transmitted to the display device 86.

A technical effect of the transformer assembly described herein is to provide a transformer assembly that includes two double interleaved spiral inductors that are connected through vias to generate relatively strong inductively coupled inductors. The coupling inductive coupling between the pair of spiral inductors may be reduced by connecting the top and bottom spiral at different locations. The transformer assembly includes two pairs of capacitors wherein one pair is coupled to each respective spiral inductor. The capacitance of one of the pairs of capacitors may be adjusted to cancel the self-inductance of one of the spiral inductors. Moreover, the capacitance of the second pair of capacitors may be adjusted to cancel the self-inductance of the second spiral inductor. The transformer assembly, in the exemplary embodiment, is installed between a pair of RF coils. In the exemplary embodiment, the pins are installed in each respective inductor to achieve a mutual inductance having a negative value. In the exemplary embodiment, the polarity of the transformer assembly may be reversed by altering the traces or utilizing jumpers on one side of the transformer assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A transformer assembly for a magnetic resonance imaging (MRI) system, said transformer assembly comprising:
   a substrate having a first surface and an opposing second surface;
   a first and a second spiral wound inductive coils formed on the first surface and forming a first double spiral arrangement such that the first coil is inductively coupled to the second coil;
   a third and a fourth-spiral wound inductive coils formed on the second surface and forming a second double spiral arrangement such that the third coil is inductively coupled to the fourth coil;
   a plurality of openings extending through the first, the second, the third, and the fourth coils; and
   a pair of pins being inserted into select ones of the plurality of openings through the first, the second, the third, and the fourth coils to adjust a mutual inductance of the transformer assembly in the MRI system.

2. A transformer assembly in accordance with claim 1 wherein the first spiral wound inductive coil is symmetrical with the third spiral wound inductive coil and the second spiral wound inductive coil is symmetrical with the fourth spiral wound inductive coil.

3. A transformer assembly in accordance with claim 1 wherein the first and third-coils are configured to be electrically coupled to a first capacitor and the second and fourth coils are configured to be electrically coupled to a second capacitor.

4. A transformer assembly in accordance with claim 1 wherein the first and third coils are configured to be electrically coupled in series to a respective capacitor, the pins being inserted into the openings based on the capacitance of the first and second capacitors.

5. A transformer assembly in accordance with claim 1 wherein the first coil is interleaved with the second coil and the third coil is interleaved with the fourth coil.

6. A transformer assembly in accordance with claim 1 wherein the first coil, the second coil, the third coil, and the fourth coil each form an Archimedes spiral.

7. A transformer assembly in accordance with claim 1 wherein the substrate is fabricated from a dielectric material and the first and second coils are fabricated from a copper material.

8. A transformer assembly in accordance with claim 1 wherein the first and second coils include a plurality of turns that are coplanar.

9. A multiple channel array coil for a magnetic resonance imaging (MRI) system, comprising:
   a first radio frequency (RF) coil;
   a second RF coil; and
   a transformer coupled between the first and second coils, the transformer comprising:
      a substrate having a first surface and an opposing second surface;
      a first and a second spiral wound inductive coils formed on the first surface and forming a double spiral arrangement such that the first coil is inductively coupled to the second coil;
      a third and a fourth spiral wound inductive coils formed on the second surface and forming a double spiral arrangement such that the third coil is inductively coupled to the fourth coil;
   a plurality of openings extending through the first, the second, the third, and the fourth coils; and
   a pair of pins being inserted into selected ones of the plurality of openings through the first, the second, the third, and the fourth coils to adjust a mutual inductance of the transformer assembly in the MRI system.

10. An array coil in accordance with claim 9 wherein the first and third spiral wound inductive coils are configured to be electrically coupled to a first capacitor and the second and fourth spiral wound inductive coils are electrically coupled to a second capacitor.

11. An array coil in accordance with claim 9 wherein the first and third-coils are electrically coupled in series to a first capacitor and the second and fourth coils are electrically coupled to a second capacitor, the pins being inserted into the openings based on the capacitance of the first and second capacitors.

12. An array coil in accordance with claim 9 wherein the first coil is interleaved with the second coil and the third coil is interleaved with the fourth coil.

13. An array coil in accordance with claim 9 wherein the first coil, the second coil, the third coil, and the fourth coil each form an Archimedes spiral.

14. An array coil in accordance with claim 9 the substrate is fabricated from a dielectric material and the first and second coils are fabricated from a copper material.

15. A transformer assembly in accordance with claim 9 wherein the first and second coils include a plurality of turns that are coplanar.

16. An array coil in accordance with claim 9 wherein the first RF coil and the second RF coil comprise surface coils.

17. A method of fabricating a transformer assembly for a magnetic resonance imaging (MRI), said method comprising:

forming a first spiral inductor and a second spiral inductor on a first surface of a dielectric such that the first spiral inductor is interleaved with the second spiral inductor;

forming a third-spiral inductor and a fourth spiral inductor on the second surface of the substrate such that the third spiral inductor is interleaved with the fourth spiral inductor;

forming a plurality of openings through the first, the second, the third, and the fourth coils; and inserting a pair of pins into selected ones of the plurality of openings through the first, the second, the third, and the fourth coils to adjust a mutual inductance of the transformer assembly in the MRI system.

18. The method of claim 17, wherein the first and third coils are electrically coupled in series to a first capacitor and the second and fourth coils are electrically coupled to a second capacitor, said method further comprising inserting the pins into the openings based on the capacitance of the first and second capacitors.

19. The method of claim 17, wherein the first coil is interleaved with the second coil and the third coil is interleaved with the fourth coil.

* * * * *